United States Patent
Tsai et al.

(10) Patent No.: US 6,176,416 B1
(45) Date of Patent: Jan. 23, 2001

(54) METHOD OF MAKING LOW-PROFILE WIRE CONNECTION

(75) Inventors: Yu-Fang Tsai; Su Tao, both of Kaohsiung (TW)

(73) Assignee: Advanced Semiconductor Engineering, Inc., Kaohsiung (TW)

(*) Notice: Under 35 U.S.C. 154(b), the term of this patent shall be extended for 0 days.

(21) Appl. No.: 09/346,681

(22) Filed: Jul. 2, 1999

(51) Int. Cl.[7] .......................... B23K 31/00; B23K 31/02; B23K 1/06; B23K 5/20; B23K 37/00
(52) U.S. Cl. .................. 228/180.5; 228/1.1; 228/4.5; 228/102; 228/110.1; 228/111
(58) Field of Search .................. 228/180.5, 4.5, 228/102, 111, 1.1, 110.1

(56) References Cited

U.S. PATENT DOCUMENTS

| | | | |
|---|---|---|---|
| Re. 35,496 | * 4/1997 | Yamamura et al. | 174/52.4 |
| 4,932,584 | 6/1990 | Yamzaki et al. | |
| 5,111,989 | 5/1992 | Holdgrafer et al. | |
| 5,156,323 | 10/1992 | Kumazawa et al. | |
| 5,961,029 | * 10/1999 | Nishiura et al. | 228/180.5 |
| 5,967,401 | * 10/1999 | Nishiura et al. | 228/180.5 |
| 5,989,995 | * 11/1999 | Nishiura et al. | 438/617 |

* cited by examiner

*Primary Examiner*—Patrick Ryan
*Assistant Examiner*—Zidia T. Pittman
(74) *Attorney, Agent, or Firm*—Bacon & Thomas

(57) ABSTRACT

A method of making low profile wire connection comprising steps of: connecting a wire to a first bonding point, moving a capillary straight up a first length, moving the capillary away from a second bonding point thus making the first reverse action to bend the wire in an appropriate angle so as to form the first bent point, again raising the capillary a second length, again moving the capillary in the direction of the second bonding point to bend the wire in an appropriate angle so as to form the second bent point, again raising the capillary a third length, moving the capillary to the second bonding point thus making an action to bend the wire in an appropriate angle so as to form the third bent point, raising the capillary a fourth length by feeding out the wire to a length which is enough to make a wire loop, and then moving the capillary down to the second bonding point where the bonding is performed.

12 Claims, 5 Drawing Sheets

METHOD OF MAKING LOW-PROFILE WIRE CONNECTION

BACKGROUND OF THE INVENTION

1. Field of the Invention

The present invention is related to a method of making low-profile wire connection between a first bonding pad in a semiconductor device and a second bonding pad. More particularly, the present invention relates to the automatic wire bonder moving its capillary bonding tool in a predetermined path.

2. Description of the Related Art

A conventional method of making wire connection includes a wire electrically connecting a first bonding pad and a second bonding pad to form a closed loop in a semiconductor device. The wire extends upward from the first bonding pad and downward to the second bonding pad, so that the wire has a high profile between the first bonding pad and the second bonding pad. Because the high profile is mechanically supported only at the point of the bonding pad, the high profile can easily be shifted by stress. When the semiconductor device is in the molding process, the liquified encapsulant material pushes the wires, which can easily to be shifted, and wire sweeping occurs.

U.S. Pat. No. 4,932,584, issued on Jun. 12, 1990 to Yamazaki et al., discloses a method of making wire connection. As shown in FIG. 1, after a wire 110 is connected to a first bonding pad 120, a capillary 100 is moved straight up an appropriate length. As shown in FIG. 2, the capillary 100 is then moved away from a second bonding pad (not shown) thus making a first reverse action to bend the wire 110 at an appropriate angle. From there, as shown in FIG. 3, the capillary 100 is again raised an appropriate length. As shown in FIG. 4, and an action is performed to bend the wire 110 at an appropriate angle, so that the capillary 100 is moved again in the direction of the second bonding pad. As shown in FIG. 5, the capillary 100 is further raised a predetermined distance by feeding out the wire 110 to a length which is enough to make a wire loop, and then the capillary 100 is moved down to the second bonding pad 130 where bonding is performed.

U.S. Pat. No. 5,111,989, issued on May 12, 1992 to Holdgrafer et al., discloses a method of making low-profile fine-wire interconnection. A method of making lowprofile slack-free fine-wire interconnections between a first bonding point on a semiconductor chip and a seconding bonding point on a lead frame lead comprising the steps of: bonding the end of fine wire to the pad of a semiconductor chip at a first bonding point employing a bonding tool mounted in a automatic wire bonder, raising the bonding tool to payout a total predetermined length of wire which is slightly smaller than the amount of wire required for a final wire interconnection, closing the wire clamps of the automatic wire bonder to prevent movement of the fine wire through the capillary bonding tool, moving the bonding tool horizontally and vertically toward an artificially generated second bonding point on a lead frame lead to create a conventional low loop height interconnection fine wire loop leaving a wire curl extending from the bonding tool, applying a first bonding force to the bonding tool that is sufficient to effect a secondary bond and is also sufficient to reduce the cross section of the fine wire at the artificially generated second bonding point, simultaneously moving the capillary bonding tool toward the second bonding point while mashing the fine wire between the lead frame lead and the working face of the moving bonding tool, reducing the loop height of said fine wire interconnection by applying a pull-down tension force on the conventional low loop by clamping the fine wire and moving the bonding tool to the second bonding point, and applying a second bonding force and ultrasonic energy to the bonding tool at the second bonding point for generating a second bond.

U.S. Pat. No. 5,156,323, issued on Oct. 20, 1992 to Kumazawa et al., discloses a wire bonding method. After a wire is connected to a first bonding point, a capillary is moved straight up and then the capillary moved away from a second bonding point (not shown) thus making the first reverse action. From there, the capillary is again raised and a second reverse action is performed so that the capillary is moved again in a direction opposite to the second bonding point. The capillary is further raised by feeding out the wire to a length which is enough to make a wire loop, and then the capillary is moved down to the second bonding point where the bonding is performed.

Neither U.S. Pat. No. 4,932,584 nor U.S. Pat. No. 5,156,323 discloses a wire connection with a sufficiently low profile so as to reduce the occurrence of wire sweeping. U.S. Pat. No. 5,111,989 discloses simultaneously mashing, forward extruding and wire drawing the fine wire under the working face of the capillary bonding tool while moving away from the first ball bond to the second bond target position. Excessive tension in the wire would create stress in the bend above the ball which is formed a neck being weakened or work hardened. However, the capillary bonding tool moving away from the first ball pad to the second bond target position pulls the neck of the ball which is still easily broken, so that reduces the reliablity of wire connection.

The present invention intends to provide a method of making low profile wire connection in such a way as to mitigate and overcome the above problem.

SUMMARY OF THE INVENTION

The primary objective of this invention is to provide a method of making low profile wire connection, which bends wire in an appropriate angle in appropriated direction to provide a low profile wire connection in order to avoid the occurrence of wire sweeping and to increase the reliablity of wire connection.

The present invention is a method of making low-profile wire connection. After a wire is connected to a first bonding point, a capillary is moved straight up a first length, and then the capillary is moved away from a second bonding point thus making a first reverse action to bend the wire in an appropriate angle so as to form the first bent point. From there, the capillary is again raised a second length and a second reverse action is performed so that the capillary is moved again in the direction of the second bonding point to bend the wire by an appropriate angle so as to form the second bent point. The capillary is raised a third length and then the capillary is moved to the second bonding point thus making an action to bend the wire in an appropriate angle so as to form the third bent point. The capillary is further raised a fourth length while feeding out the wire to a length which is enough to make a wire loop, and then the capillary is moved down to the second bonding point where the bonding is performed.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

A method of making low profile wire connection in accordance with the present invention mainly comprises a wire connecting the first bonding point to the second bonding point. The wire mainly comprises a first bent point, a second bent point and a third bent point which are determined by the profile of the wire connection.

Figure 6:
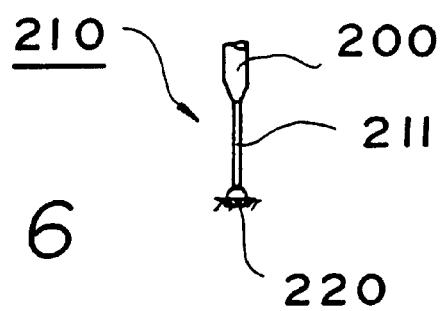
FIG. 6 is a side view of the first step of wire connection in accordance with the present invention.

Referring to FIG. 6, a method of making low-profile wire connection in accordance with the present invention includes a wire 210 which is connected to a first bonding pad 220 by a capillary 200 defining the first bonding point on the first bonding pad 220, and the capillary 200 is further moved straight up slightly and stopped temporarily at a point to form a first length 211.

Figure 7:
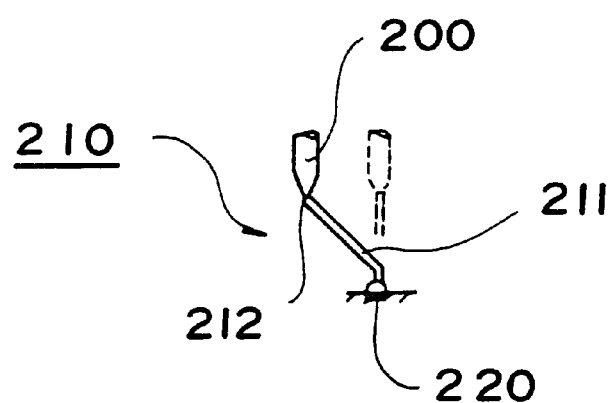
FIG. 7 is a side view of the second step of wire connection in accordance with the present invention.

Referring to FIG. 7, then the capillary 200 is moved away from a second bonding point thus making a first reverse action to bend the wire 210 in an appropriate angle so as to form the first bent point 212.

Figure 8:
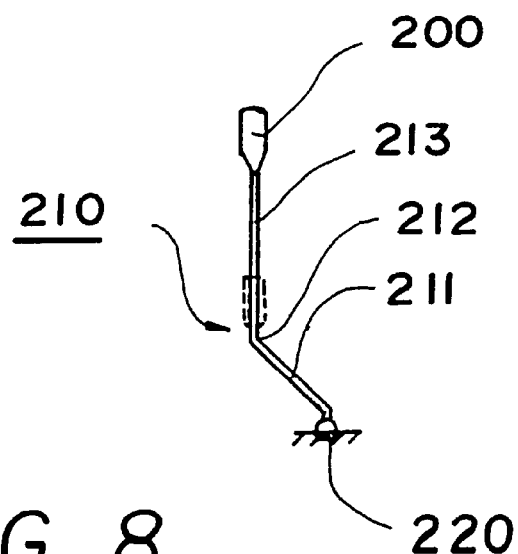
FIG. 8 is a side view of the third step of wire connection in accordance with the present invention.

Referring to FIG. 8, the capillary 200 is raised to a point and stopped temporarily at a point to form a second length 213.

Figure 9:
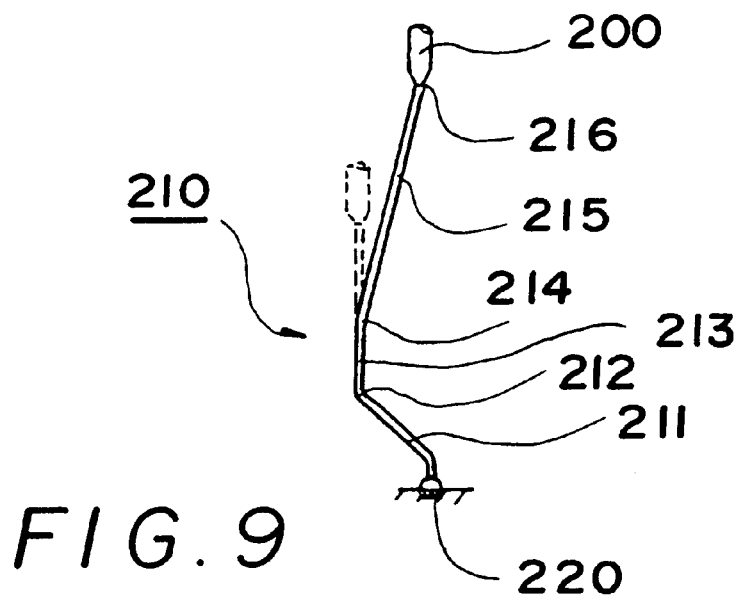
FIG. 9 is a side view of the fourth step of wire connection in accordance with the present invention.

Referring to FIG. 9, the capillary 200 is moved again in the direction of the second bonding point to bend the wire 210 in an appropriate angle so as to form the second bent point 214. The capillary 200 is raised to a point and stopped temporarily at a point to form a third length 215 which is longer than the second length 213.

Figure 10:
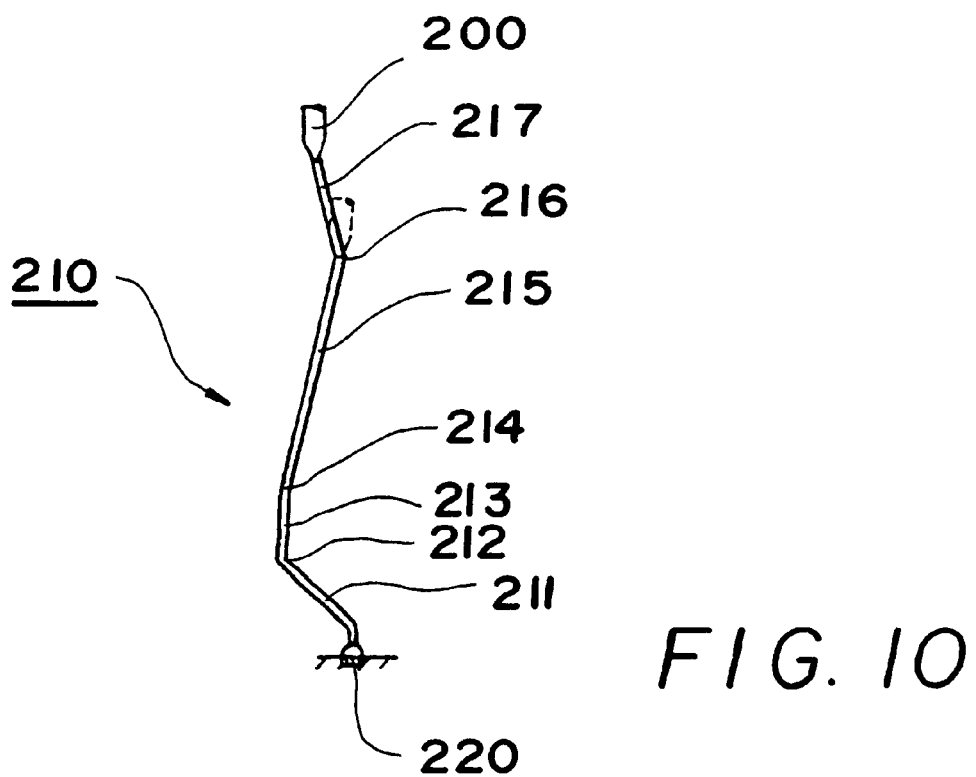
FIG. 10 is a side view of the fifth step of wire connection in accordance with the present invention.

Referring to FIG. 10, the capillary 200 is moved again in a direction opposite to the second bonding point to bend the wire 210 in an appropriate angle so as to form the third bent point 216. The capillary 200 is raised again to a point and stopped temporarily or for a moment at a point to form a fourth length 217 which is shorter than the third length 215 and feed out wire 210 to a predetermined length in an amount sufficient for connecting wire 210 to the second bonding point. Therefore, wire 210 comprises a first length 211, the first bent point 212, a second length 213, the second bent point 214, a third length 215, the third bent point 216 and a fourth length 217 in sequence.

Figure 11:
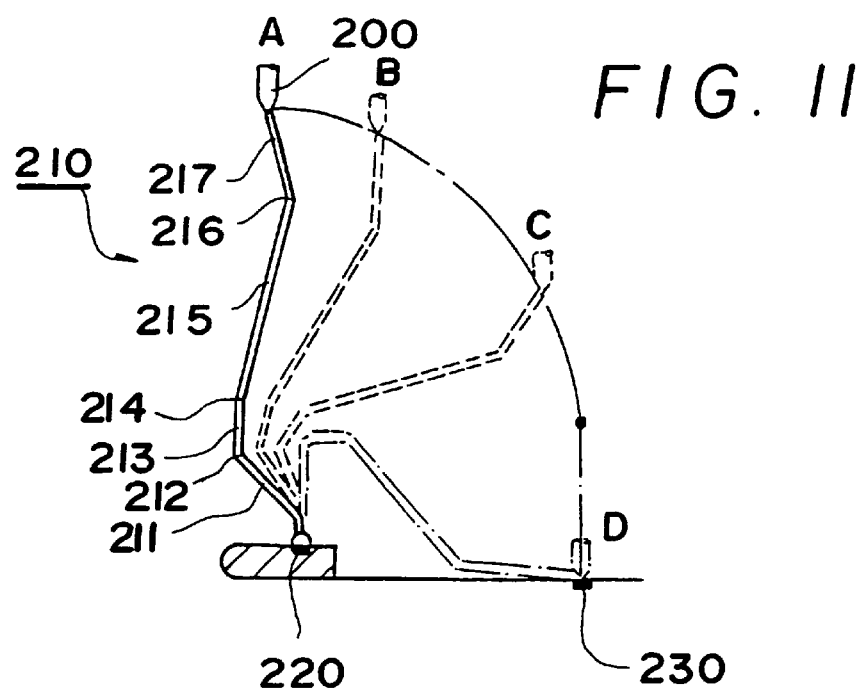
FIG. 11 is a side view of the sixth step of wire connection in accordance with the present invention.

Referring to FIG. 11, one end of wire 210 connects with the first bonding pad 220 and the other end of wire 210 is bonded to the second bonding pad 230 by a thermocompression bond of the capillary 200 defining a second bonding point on the second bonding pad 230. The capillary 200 is moved slightly through points A, B and C in sequence. Subsequently the capillary 200 bonds the wire 210 to the second bonding pad 230 by a thermocompression bond resulting in interconnection. When the fourth length 217 is in its extreme position close to the substrate then wire 210 has a low-profile wire connection between the first bonding pad 220 and the second bonding pad 230.

Figure 12:
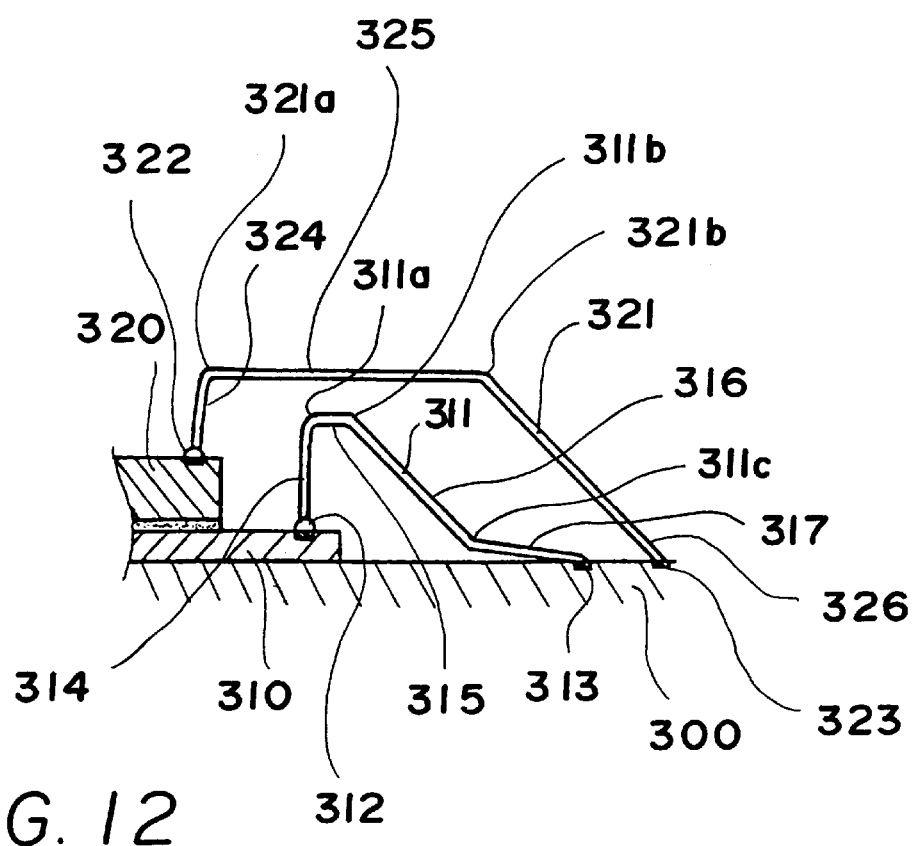
FIG. 12 is a side view of an embodiment in accordance with the present invention.

Referring to FIG. 12, the method of making low-profile wire connection in the present invention applies to the preferred embodiment. A stacked multichip module semiconductor comprises a substrate 300, a first chip 310 and a second chip 320. The first chip 310 is attached to the substrate 300, and the second chip 320 is attached to the first chip 310. The first wire 311 connecting the substrate 300 and the first chip 310 has the low-profile wire connection of the present invention, and the second wire 321 connects the substrate 300 and the second chip 320 by forward bonding. The first wire loop 311 connects the first bonding point 312 on the first chip 310 and the second bonding point 313 on the substrate 300. The first wire loop 311 includes a neck height portion 314, a trapezoidal length portion 315 and inclined portions 316 and 317 along with two kinks 311a and 311b formed at both ends of the trapezoidal length portion 315. According to the present invention, a third kink 311c is further formed between the first inclined portion 316 and the second inclined portion 317 so that the inclined portions 316 and 317 are depressed downward or toward the substrate 300. Since the kink 311c is formed in the inclined portions 316 and 317 of the wire loop 311 so that the inclined portions 316 and 317 have a depressed or downward bent shape toward the substrate 300, the inclined portions 316 and 317 of the wire loop 311 is more closer to the substrate 300. The second wire loop 321 connects the third bonding point 322 on the second chip 320 and the fourth bonding point 323 on the substrate 300. The second wire loop 321 includes a neck height portion 324, a trapezoidal length portion 325 and an inclined portion 326 along with two kinks 321a and 321b formed at both ends of the trapezoidal length portion 325. As noted above, since the inclined portions 316 and 317 of the first wire loop 311 have a depressed or downward bent shape toward the substrate 300, the distance between the inclined portions 316 and 317 of the first wire loop 311 and the inclined portion 326 of the second wire loop 321 is significantly increased so as to reduce the cross talk therebetween. Preferably, the first inclined portion 316 is longer than the trapezoidal length portion 315 and the second inclined portion 317 respectively, which results in greater downward bent shape toward the substrate 300, thereby increasing the distance between the inclined portions 316 and 317 of the first wire loop 311 and the inclined portion 326 of the second wire loop 321 so as to reduce the cross talk therebetween.

Figure 1:
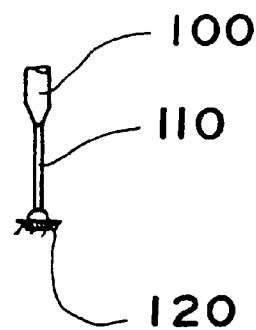
FIG. 1 is a side view of the first step of wire connection in accordance with U.S. Pat. No. 4,932,584.
Figure 2:
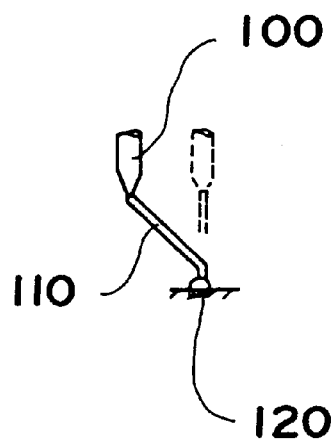
FIG. 2 is a side view of the second step of wire connection in accordance with U.S. Pat. No. 4,932,584.
Figure 3:
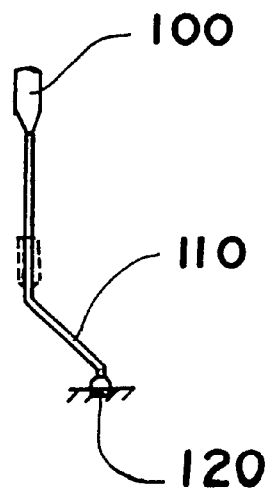
FIG. 3 is a side view of the third step of wire connection in accordance with U.S. Pat. No. 4,932,584.
Figure 4:
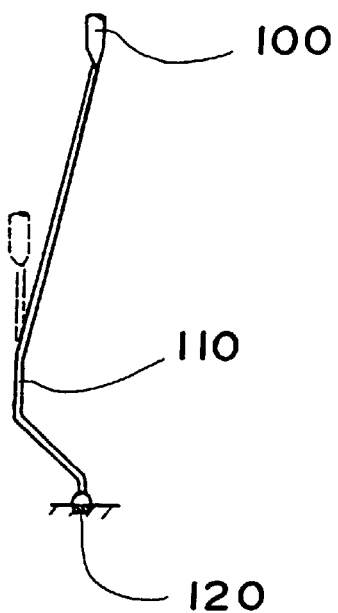
FIG. 4 is a side view of the fourth step of wire connection in accordance with U.S. Pat. No. 4,932,584.
Figure 5:
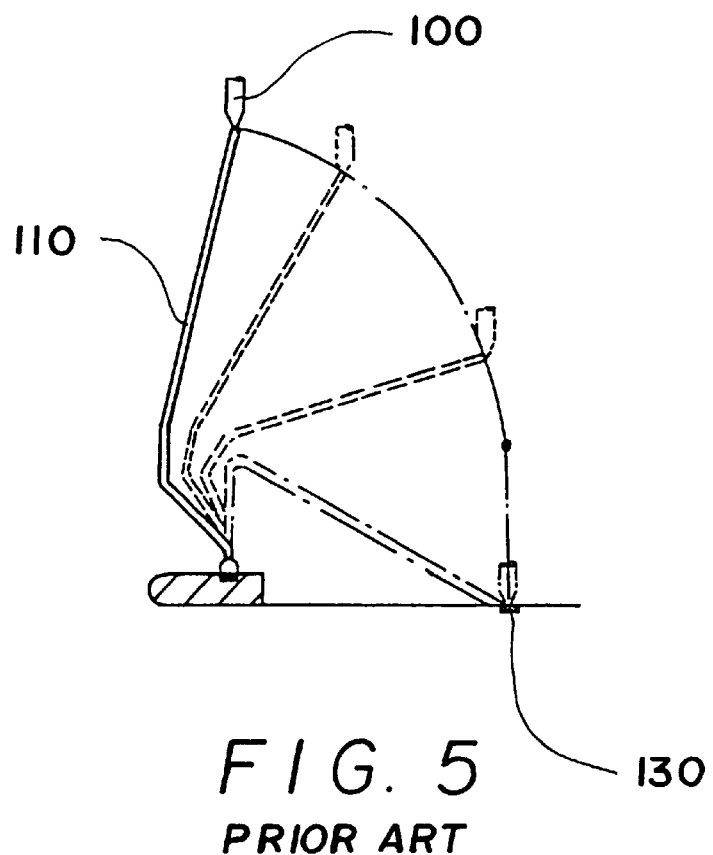
FIG. 5 is a side view of the fifth step of wire connection in accordance with U.S. Pat. No. 4,932,584.

Comparing to FIGS. 11 and 5, the present invention is comparable to U.S. Pat. No. 4,932,584 in that the fourth length 217 of wire 210 approaches extremely close to the substrate to reduce the occurrence of wire sweeping and to increase reliablity. The present invention comprises the first bent point 212, the second bent point 214 and the third bent point 216 on wire 210 resulting in better wire structure than U.S. Pat. No. 4,932,584 in that the bent points reduce the occurrence of wire 210 deformation.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A method of making low profile wire connection in which a first bonding point and a second bonding point are connected by a wire, and the method comprising the steps of:

connecting said wire to said first bonding point;

performing a first reverse action in which a capillary is raised slightly for a first length and is then moved slightly in an opposite direction from said second bonding point;

moving said capillary substantially upward for a second length;

performing a second reverse action in which a capillary is raised slightly for a third length, after which said capillary is moved slightly toward said second bonding point, and is then raised and moved slightly for a fourth length in an opposite direction from said second bonding point; and moving said capillary toward the second bonding point and then connecting said wire to the second bonding point.

2. The method of making low profile wire connection as claimed in claim 1, wherein the third length of the wire is longer than the second length of the wire.

3. The method of making low profile wire connection as claimed in claim 1, wherein the third length of the wire is longer than the fourth length of the wire.

4. A low profile wire bonding method for connecting a first bonding point and a second bonding point by a wire which passes through a capillary movable vertically and horizontally, the method comprising the steps of:

connecting said wire to said first bonding point;

raising said capillary slightly for a first length and then moving said capillary slightly in an opposite direction from said second bonding point;

moving said capillary substantially upward for a second length;

raising said capillary for a third length and then moving said capillary slightly toward said bonding point;

raising said capillary for a fourth length and then moving said capillary slightly in an opposite direction from said second bonding point; and moving said capillary toward the second bonding point and then connecting said wire to the second bonding point.

5. The method of making low profile wire connection as claimed in claim 4, wherein the third length of the wire is longer than the second length of the wire.

6. The method of making low profile wire connection as claimed in claim 4, wherein the third length of the wire is longer than the fourth length of the wire.

7. A wire bonding method for a stacked multichip device comprising a substrate, a first chip attached on the substrate and a second chip attached on the first chip, the method comprising the steps of:

connecting a first wire to a first bonding point on said first chip;

performing a first reverse action in which a capillary is raised slightly for a first length and is then moved slightly in an opposite direction from a second bonding point on said substrate;

moving said capillary substantially upward for a second length;

performing a second reverse action in which a capillary is raised slightly for a third length, after which said capillary is moved slightly toward said second bonding point, and is then raised and moved slightly for a fourth length in an opposite direction from said second bonding point;

moving said capillary toward the second bonding point and then connecting said first wire to the second bonding point;

connecting a second wire to a third bonding point on said second chip;

performing a third reverse action in which a capillary is raised slightly and is then moved slightly in an opposite direction from a fourth bonding point on said substrate;

performing a fourth reverse action in which a capillary is raised slightly, after which said capillary is moved slightly toward said fourth bonding point, and is then raised and moved slightly in an opposite direction from said fourth bonding point; and moving said capillary toward the fourth bonding point and then connecting said second wire to said fourth bonding point;

wherein said first wire forms a substantially trapezoidal wire loop connecting said first bonding point and said second bonding point, said first wire loop includes a first neck height portion, a first trapezoidal length portion and a first inclined portion and an downward depression is formed at said first inclined portion of said first wire loop; and said second wire forms a substantially trapezoidal wire loop connecting said third bonding point and said fourth bonding point, said second wire loop includes a second neck height portion, a second trapezoidal length portion and a second inclined portion, whereby the distance between said first inclined portion of said first wire loop and said second inclined portion of said second wire loop is significantly increased so as to reduce the cross talk therebetween.

8. The method as claimed in claim 7, wherein the third length of the wire is longer than the second length of the wire.

9. The method as claimed in claim 7, wherein the third length of the wire is longer than the fourth length of the wire.

10. A stacked multichip device having a substrate, a first chip attached on the substrate and a second chip attached on the first chip, the stacked multichip device comprising:

a first wire loop of a substantially trapezoidal shape connecting the first chip to the substrate, the first wire loop having a first neck height portion, a first trapezoidal length portion, a first inclined portion and a second inclined portion;

a second wire loop of a substantially trapezoidal shape connecting the second chip to the substrate, the second wire loop having a second neck height portion, a second trapezoidal length portion and a third inclined portion; and a downward depression formed intermediate the first inclined portion and the second inclined portion of the first wire loop.

11. The stacked multichip device as claimed in claim 10, wherein the first inclined portion is longer than the first trapezoidal length portion.

12. The stacked multichip device as claimed in claim 10, wherein the first inclined portion is longer than the second inclined portion.

* * * * *